(12) United States Patent
Yan et al.

(10) Patent No.: US 11,511,250 B2
(45) Date of Patent: Nov. 29, 2022

(54) METHOD AND APPARATUS FOR PREPARING COMPOSITE

(71) Applicant: CHINA ENFI ENGINEERING CORPORATION, Beijing (CN)

(72) Inventors: Dazhou Yan, Beijing (CN); Tao Yang, Beijing (CN); Cheng Liu, Beijing (CN); Qiang Sun, Beijing (CN); Ye Wan, Beijing (CN); Wenxue Si, Beijing (CN); Shengxue Zhang, Beijing (CN)

(73) Assignee: CHINA ENFI ENGINEERING CORPORATION, Beijing (CN)

( * ) Notice: Subject to any disclaimer, the term of this patent is extended or adjusted under 35 U.S.C. 154(b) by 0 days.

(21) Appl. No.: 17/496,091

(22) Filed: Oct. 7, 2021

(65) Prior Publication Data
US 2022/0134299 A1  May 5, 2022

(30) Foreign Application Priority Data

Nov. 5, 2020 (CN) .......................... 202011222490.1
Nov. 5, 2020 (CN) .......................... 202022538121.5

(51) Int. Cl.
*B01J 8/08* (2006.01)
*B01J 8/10* (2006.01)
(Continued)

(52) U.S. Cl.
CPC .............. *B01J 8/085* (2013.01); *B01J 4/007* (2013.01); *B01J 8/003* (2013.01); *B01J 8/0055* (2013.01);
(Continued)

(58) Field of Classification Search
CPC ..... B01J 8/10; B01J 8/085; B01J 8/087; B01J 8/002; B01J 8/003; B01J 8/006; B01J 8/0075; B01J 8/0055; B01J 19/28; B01J 19/0073; B01J 2208/00212; B01J 2208/00769; C01B 33/021; C01B 33/035
See application file for complete search history.

(56) References Cited

U.S. PATENT DOCUMENTS 5,637,284 A * 6/1997 Sato .................... C03B 19/1095
106/482

FOREIGN PATENT DOCUMENTS

CN          113603093 A  * 11/2021

OTHER PUBLICATIONS

Machine Translation of CN 113603093 A (Year: 2021).*

* cited by examiner

*Primary Examiner* — Lessanework Seifu
(74) *Attorney, Agent, or Firm* — Maier & Maier, PLLC

(57) ABSTRACT

A method and apparatus for preparing a composite, in which the angle between the apparatus base and the apparatus body is adjusted by the elevator device, the solid raw material is loaded into the reactor by the solid feeding device, the main reaction gas, the auxiliary gas and the carrier gas are introduced from the front gas intake unit into the main reaction zone at a preset ratio, followed by the active material deposited on solid particles, the post-processing reaction gas is introduced from the middle gas intake unit to the post-processing reaction zone to form a functional layer on the active material, the prepared composite powder is separated and collected from the gas-solid mixture in the collection device. The exhaust gas is released from the exhaust manifold into an exhaust gas treatment system after minority powder filtered by the filter.

20 Claims, 3 Drawing Sheets

(51) Int. Cl.
*C01B 33/021* (2006.01)
*B01J 19/28* (2006.01)
*B01J 8/00* (2006.01)
*B01J 4/00* (2006.01)
*B01J 19/00* (2006.01)

(52) U.S. Cl.
CPC ............ *B01J 8/0075* (2013.01); *B01J 8/087* (2013.01); *B01J 19/0013* (2013.01); *B01J 19/0073* (2013.01); *B01J 19/28* (2013.01); *C01B 33/021* (2013.01); *B01J 8/10* (2013.01); *B01J 2208/00212* (2013.01); *B01J 2208/00769* (2013.01); *B01J 2208/00814* (2013.01); *B01J 2208/00938* (2013.01); *B01J 2208/065* (2013.01); *B01J 2219/00087* (2013.01); *B01J 2219/187* (2013.01); *B01J 2219/1943* (2013.01)

METHOD AND APPARATUS FOR PREPARING COMPOSITE

CROSS-REFERENCE TO RELATED APPLICATIONS

This application claims priority to Chinese Patent Application No. 202011222490.1, and Chinese Patent Application No. 202022538121.5, both filed on Nov. 5, 2020, the entire content of which is incorporated herein by reference for all purposes.

FIELD

The present disclosure relates to the field of material preparation technology, and more particularly to a method and apparatus for preparing a composite.

BACKGROUND

Generally, a composite preparation process is an important material production technology, which is of great significance to heterostructure materials with special functions and is also an important way to break the bottleneck in the application of silicon-based anode materials. However, the existing processes still have many defects, such as poor structural control, low production efficiency, and high production costs.

Silicon-based composites are usually prepared by chemical vapor deposition (CVD) with silane precursor. However, there are many problems in continuous large-scale production for the CVD process: (1) silane is one kind of hazardous chemicals and has extremely high safety risks when used in large-scale production; (2) silane is expensive, and it is difficult to control production costs; (3) the CVD process includes various steps, and has poor continuity, low production efficiency and high operating costs. Therefore, it is necessary to develop a safe, efficient, and inexpensive method and apparatus for the preparation of silicon-based composites.

SUMMARY

Embodiments of the present disclosure seek to solve at least one of the problems existing in the related art to at least some extent.

According to the first aspect of embodiments of the present disclosure, an apparatus for preparing a composite is provided. The apparatus includes an apparatus base, an apparatus body, and an elevator device disposed on the apparatus base. The elevator device is configured to adjust an angle between the apparatus base and the apparatus body. The apparatus body includes a solid feeding bin, gas intake units, a heating module, a reactor, a collection device, an exhaust unit and a control unit. The control unit is connected and communicated with the solid feeding bin, the gas intake units, the heating module, the reactor, the collection device and the exhaust unit, respectively. A solid feeding device is disposed inside the solid feeding bin, and the reactor, the solid feeding device and the collection device are connected and sealed by a magnetic fluid device. The gas intake units include a front gas intake unit and a middle gas intake unit. A front feeding port is disposed at the inlet of the reactor, and a middle feeding port is disposed at the middle of the reactor. The front feeding port is connected with the solid feeding device and the front gas intake unit, respectively, and the middle feeding port is connected with the middle gas intake unit. An outlet is disposed at the tail of the reactor, and is connected with the collection device. The reactor is divided into a first region and a second region by the middle feeding port. The first region is a main reaction zone, and the second region is a post-processing reaction zone. The reactor is wrapped inside the heating module, and the heating module is configured to heat the main reaction zone and the post-processing reaction zone to target reaction temperatures, and maintain the temperatures constant. The collection device is configured to separate and collect the product from the gas-solid mixture. The exhaust unit is connected with the collection device by an outlet of an exhaust manifold. The exhaust unit is composed of a vacuum pump and a filter, the vacuum pump is configured to regulate the internal pressure of the reactor, and the filter is configured to capture powders in the exhaust.

According to the second aspect of embodiments of the present disclosure, a method is provided for preparing a composite by the apparatus as described in any embodiments hereinbefore. The method includes: loading a solid raw material into the solid feeding bin; closing all gas intake valves of the apparatus; starting the vacuum pump of the exhaust unit to extract air inside the apparatus, introducing high purity nitrogen through the front gas intake unit and the middle gas intake unit, and repeating the above operations to remove oxygen completely; replacing nitrogen by working carrier gas, and maintaining a constant flow of carrier gas according to process conditions; adjusting the apparatus to a presetted inclination angle, and heating the main reaction zone and the post-processing reaction zone to the target reaction temperatures through the heating module, and maintaining the temperatures constant; setting a solid feed rate, gas intake parameters and a reactor rotation rate; introducing the powders by the solid feeding device, introducing the main reaction gas, the auxiliary gas and the carrier gas from the front gas intake unit into the main reaction zone at a presetted ratio, followed by the active material deposited on solid particles, and introducing the post-processing reaction gas from the middle gas intake unit to the post-processing reaction zone to form a functional layer on the active material; most of the composite product transported to the collection device after passing through the outlet of the reactor, and separated from the gas-powder mixture and sediment in the collection device; and releasing the exhaust gas from the outlet of the exhaust manifold of the collection device to the exhaust gas treatment system after minority powder captured by the filter.

BRIEF DESCRIPTION OF THE DRAWINGS

These and/or other aspects and advantages of embodiments of the present disclosure will become apparent and more readily appreciated from the following descriptions of the drawings, in which.

DETAILED DESCRIPTION OF THE EMBODIMENTS

Figure 1:
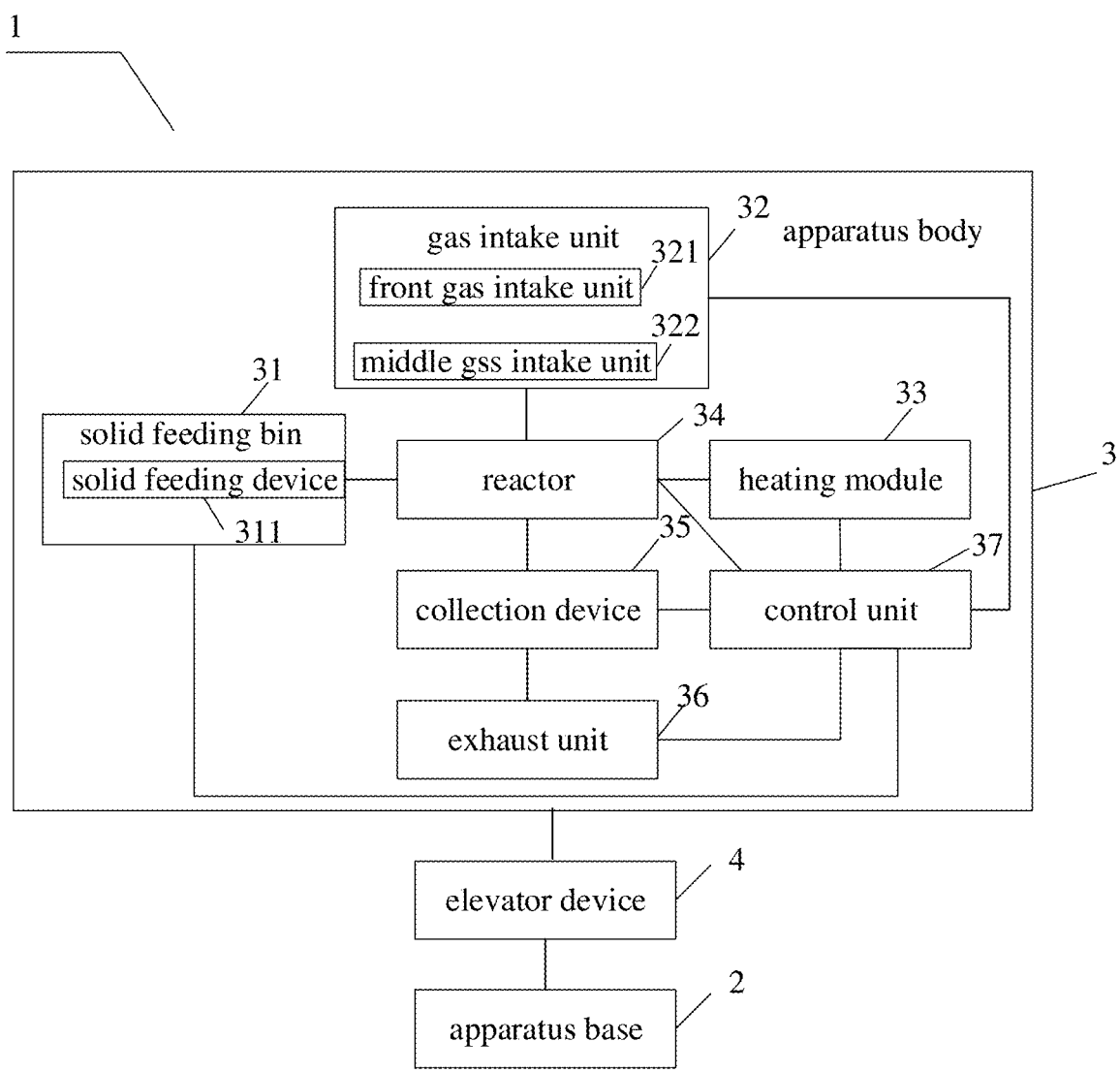
FIG. 1 is a module configuration of an apparatus for preparing a composite according to an embodiment of the present disclosure.

Embodiments of the present disclosure will be described below in detail, examples of which are illustrated in the drawings. The same or similar elements and the elements having same or similar functions are denoted by alike reference numerals throughout the descriptions. The embodiments described herein with reference to drawings are explanatory, and used to generally understand the present disclosure. The embodiments shall not be construed to limit the present disclosure.

According to the first aspect of embodiments of the present disclosure, an apparatus for preparing a composite is provided. The apparatus includes an apparatus base, an apparatus body, and an elevator device disposed on the apparatus base. The elevator device is configured to adjust the angle between the apparatus base and the apparatus body. The apparatus body includes a solid feeding bin, gas intake units, a heating module, a reactor, a collection device, an exhaust unit and a control unit. The control unit is connected and communicated with the solid feeding bin, the gas intake units, the heating module, the reactor, the collection device and the exhaust unit, respectively. A solid feeding device is disposed inside the solid feeding bin, and the reactor, the solid feeding device and the collection device are connected and sealed by a magnetic fluid device. The gas intake units include a front gas intake unit and a middle gas intake unit. A front feeding port is disposed at a first end of the reactor, and a middle feed port is disposed at the middle of the reactor. The front feeding port is connected with the solid feeding device and the front gas intake unit, respectively, and the middle feeding port is connected with the middle gas intake unit. An outlet is disposed at a second end of the reactor and the outlet is connected with the collection device. The reactor is divided into a first region and a second region by the middle feeding port. The first region is a main reaction zone, and the second region is a post-processing reaction zone. The reactor is wrapped inside the heating module, and the heating module is configured to heat the main reaction zone and the post-processing reaction zone to target reaction temperatures, and maintain the temperatures constant. The collection device is configured to separate and collect the product from the gas-solid mixture. The exhaust unit is connected with the collection device by an outlet of the exhaust manifold. The exhaust unit includes a vacuum pump and a filter, the vacuum pump is configured to regulate the internal pressure of the reactor, and the filter is configured to capture solid powders in exhaust gas.

In an embodiment of the present disclosure, the reactor is a tubular reactor, fins are uniformly distributed on the inner wall of the tubular reactor, and the fins are used for stirring the solid powder to make the solid powder in full contact with gas reactants.

In an embodiment of the present disclosure, the tubular reactor is rotatable around a central axis thereof.

In an embodiment of the present disclosure, the tubular reactor is made of quartz or corundum, and has an outlet with a tapered diameter structure.

In an embodiment of the present disclosure, the heating module includes a heating element, and the heating element is composed of silicon molybdenum bars. The heating module adopts a configuration of multi-segment temperature zones, which are independently controlled by intelligent programs. The heating module has an openable steel shell, and the space between the heating module and the reactor is filled with thermal insulation materials made of aluminum oxide fibers.

In an embodiment of the present disclosure, the collection device includes an electrostatic collector or a cyclone separator.

In an embodiment of the present disclosure, the front gas intake unit includes a three-way mass flow meter, which controls the flow rates of reaction gas, auxiliary gas and carrier gas, respectively, and mixes and feeds the reaction gas, the auxiliary gas and the carrier gas into the reactor. The middle gas intake unit includes a two-way mass flow meter, which controls the flow rates of post-processing reaction gas and carrier gas, respectively, and mixes and feeds the post-processing reaction gas and the carrier gas into the reactor.

In an embodiment of the present disclosure, gas intake nozzles of the front gas intake unit and the middle gas intake unit adopt a coaxial tube type, and inner walls of the front gas intake unit and the middle gas intake unit adopt a spiral fin design.

In an embodiment of the present disclosure, the solid feeding bin is made from stainless steel, has a cuboid cavity, and includes a top cover and a bin body, and a silicone sealing ring is arranged between the top cover and the bin body.

In the apparatus for preparing a composite according to embodiments of the present disclosure, the angle between the apparatus base and the apparatus body is adjusted by the elevator device, the solid raw material is loaded into the reactor by the solid feeding device, the main reaction gas, the auxiliary gas and the carrier gas are introduced from the front gas intake unit into the main reaction zone at a presetted ratio, followed by the an active material deposited on solid particles, and the post-processing reaction gas is introduced from the middle gas intake unit to the post-processing reaction zone to form a functional layer on the active material. The reaction mixture is sent into the collection device through the outlet of the reactor, and the composite powder is separated from the gas-solid mixture in the collection device. The exhaust gas is released from the outlet of the exhaust manifold of the collection device to an exhaust gas treatment system after minority powder filtered by the filter. As a result, a safe, efficient and inexpensive composite preparation apparatus is provided, such that the composite may be prepared by solid and gas raw materials, which is of great significance to the production and application of high-performance silicon-based composite materials.

According to the second aspect of embodiments of the present disclosure, a method is provided for preparing a composite by the apparatus as described in any embodiments hereinbefore. The method includes: loading a solid raw material into the solid feeding bin; closing all gas intake valves of the apparatus; starting the vacuum pump of the exhaust unit to extract air inside the apparatus, introducing high purity nitrogen through the front gas intake unit and the middle gas intake unit, and repeating the above operations to remove oxygen completely; replacing nitrogen by working carrier gas, and maintaining a constant flow of carrier gas according to process conditions; adjusting the apparatus to a presetted inclination angle, and heating the main reaction zone and the post-processing reaction zone to the target reaction temperatures through the heating module, and maintaining the temperatures constant; setting a solid feed rate, gas intake parameters and a reactor rotation rate; introducing the powders by the solid feeding device, introducing the main reaction gas, the auxiliary gas and the carrier gas from the front gas intake unit into the main reaction zone at a presetted ratio, followed by the active material deposited on solid particles, and introducing the post-processing reaction gas from the middle gas intake unit to the post-processing reaction zone to form a functional layer on the active material; most of the composite product transported to the collection device after passing through the outlet of the reactor, and separated from the gas-powder mixture and sediment in the collection device; the exhaust gas released from the outlet of the exhaust manifold of the collection device to the exhaust gas treatment system after minority powder captured by the filter.

The method and apparatus for preparing a composite according to embodiments of the present disclosure are described below with reference to the drawings.

The apparatus for preparing a composite will now be described in connection with FIG. 1 and FIG. 2.

Figure 2:
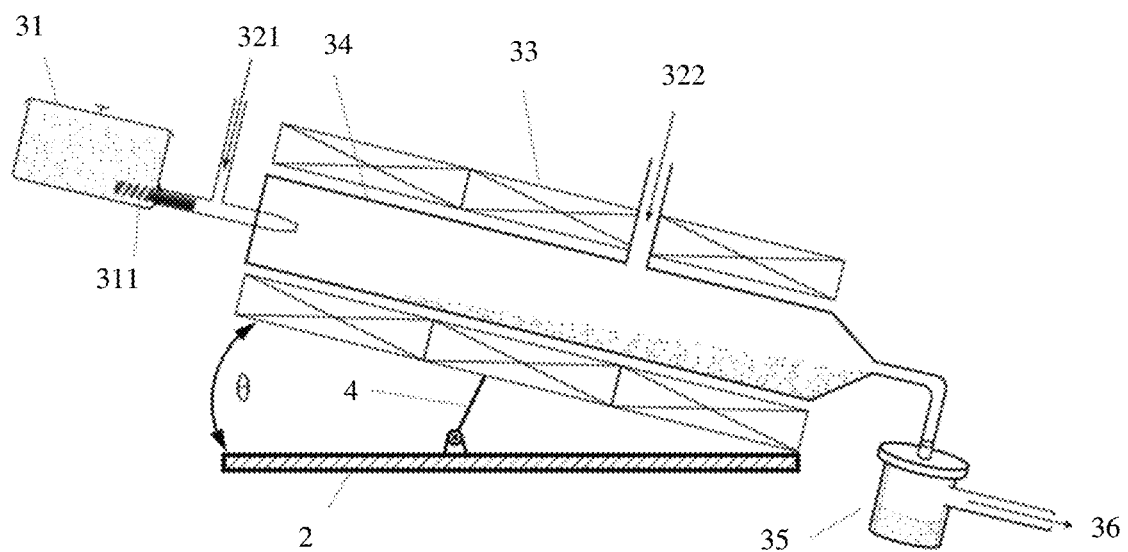
FIG. 2 is a schematic structural diagram of an apparatus for preparing a composite according to an embodiment of the present disclosure.

As shown in FIG. 1 and FIG. 2, the apparatus 1 for preparing the composite includes an apparatus base 2, an apparatus body 3 and an elevator device 4 disposed on the apparatus base 2.

The elevator device 4 is configured to adjust the angle between the apparatus base 2 and the apparatus body 3.

The apparatus body 3 includes a solid feeding bin 31, gas intake units 32, a heating module 33, a reactor 34, a collection device 35, an exhaust unit 36 and a control unit 37. The control unit 37 is connected and communicated with the solid feeding bin 31, the gas intake units 32, the heating module 33, the reactor 34, the collection device 35 and the exhaust unit 36, respectively. In embodiments of the present disclosure, the control unit 37 includes a control program for automatically controlling the apparatus 1.

A solid feeding device 311 is disposed inside the solid feeding bin 31.

The gas intake units 32 include a front gas intake unit 321 and a middle gas intake unit 322.

A front feeding port is disposed at the inlet of the reactor 34, and a middle feeding port is disposed at the middle of the reactor 34. The front feeding port is connected with the solid feeding device 311 and the front gas intake unit 321, respectively, and the middle feeding port is connected with the middle gas intake unit 322. An outlet is disposed at the tail of the reactor 34, and the outlet is connected with the collection device 35.

The reactor 34 is divided into a first region and a second region by the middle feeding port, the first region is a main reaction zone, and the second region is a post-processing reaction zone.

According to embodiments of the present disclosure, by integrating the main reaction zone and the post-processing reaction zone in the same reactor 34, the composite can be prepared in one step, thereby reducing the process flow.

The heating module 33 wraps around the reactor 34, and is configured to heat the main reaction zone and the post-processing reaction zone to target reaction temperatures, and maintain the temperatures constant.

The collection device 35 is configured to separate and collect the product from the gas-solid mixture.

The exhaust unit 36 is connected with the collection device 35 by an outlet of an exhaust manifold. The exhaust unit 36 includes a vacuum pump and a filter. The vacuum pump is configured to regulate the internal pressure of the reactor 34, and the filter is configured to capture powders in the exhaust.

In an embodiment of the present disclosure, the apparatus base 2 is arranged horizontally. In embodiments of the present disclosure, the angle between the apparatus base 2 and the apparatus body 3 may be adjusted to 90° by the elevator device 4 to make the apparatus 1 to be a vertical apparatus, and in such a case, the feeding types of the apparatus can be a gas-solid countercurrent fluidized bed type and a gas-solid down-flow type.

In some embodiments of the present disclosure, the apparatus body 3 may be adjusted to be oblique relative to the apparatus base 2 by the elevator device 4. In this case, the angle between the apparatus base 2 and the apparatus body 3 may be in a range of 0 to 40°. It is to be understood that, in actual application, the angle between the apparatus base 2 and the apparatus body 3 may be adjusted as required, which will not be particularly limited herein.

FIG. 2 is a schematic structural diagram of an apparatus having an oblique structure according to an embodiment of the present disclosure. It should be noted that the control unit is not shown in the apparatus 1 as illustrated in FIG. 2.

In some embodiments of the present disclosure, the angle between the apparatus base 2 and the apparatus body 3 may be equal to 0°, that is, the apparatus 1 is arranged horizontally, such that the apparatus 1 becomes a batch-type preparation apparatus.

This is to say, the apparatus 1 according to embodiments of the present disclosure may be in a vertical type, a horizontal type, or an angle-adjustable inclined type.

In some embodiments of the present disclosure, the solid feeding bin 31 is made from stainless steel and has a cuboid cavity. The solid feeding bin 31 includes a top cover and a bin body, and a silicone sealing ring is arranged between the top cover and the bin body.

In some embodiments of the present disclosure, the solid feeding device 311 includes a precision screw feeder to realize the precise metering and continuous feeding of powders. The outlet of the solid feeding device 311 is connected with the front feeding port of the reactor 34.

In some embodiments of the present disclosure, in order to precisely control the gas entered into the apparatus 1, the front gas intake unit 321 may include a three-way mass flow meter, which controls flow rates of reaction gas (e.g. silicon source gas), auxiliary gas (e.g. dopant gas) and carrier gas, respectively, and mixes and feeds them into the reactor 34. The middle gas intake unit 322 may include a two-way mass flow meter, which controls flow rates of post-processing reaction gas (e.g. carbon source gas) and carrier gas, respectively, and mixes and feeds them into the reactor 34.

In some embodiments of the present disclosure, in order to enhance the mixing effect, gas intake nozzles of the front gas intake unit 321 and the middle gas intake unit 322 each adopt a coaxial tube type, and inner walls of the front gas intake unit 321 and the middle gas intake unit 322 adopt a spiral fin design, such that the gas is ejected in a spiral manner to enhance convective mass transfer.

In some embodiments of the present disclosure, in order to control the temperatures of the main reaction zone and the post-processing reaction zone in the reactor 34 accurately, the heating module 33 includes a heating element. The heating element is composed of silicon molybdenum bars. The heating module adopts a configuration of multi-segment temperature zones, which are independently controlled by intelligent programs. The heating module has an openable steel shell, and the space between the heating module and the shell is filled with thermal insulation materials made of aluminum oxide fibers.

The maximum temperature of the silicon molybdenum bar may be 1500° C. It should be noted that other heating elements may also be used depending on the process requirements, which can be selected by those skilled in the art as required.

In some embodiments, each temperature zone may be independently controlled by multi-segment programs.

In some embodiments of the present disclosure, the reactor 34 may be a tubular type. The reactor 34 may be a tubular reactor 341. The material of the tubular reactor 341 is a high-temperature resistant material, which may include, but not be limited to, quartz and corundum.

In some embodiments of the present disclosure, in order to make the solid raw material be in full contact with the gas reactants, and make the deposition uniform, fins are uniformly distributed on the inner wall of the tubular reactor 341 to stir the solid powder, thereby making the solid raw material be in full contact with the gas reactants and making the deposition uniform.

In embodiments of the present disclosure, the fins (as lifter devices) in the reactor 34 ensure the full contact and uniform reaction of the gas-solid materials, such that active ingredients are tightly combined with a substrate and evenly distributed on the substrate, which is capable of control the particle size and compositions of the product, thereby achieving a good composite effect.

In some embodiments of the present disclosure, in order to further enhance the contact of the solid powder with the gas reactants, the tubular reactor 341 may be rotated around a central axis thereof, and a rotating speed of the tubular reactor 341 around its central axis is adjustable, for example the rotating speed may be in a range of 0 to 20 rpm.

In an embodiment of the present disclosure, in order to improve the sealing performance of the apparatus 1, the tubular reactor 341 and the solid feeding device 311 are connected and sealed by a magnetic fluid device, and the tubular reactor 341 and the collection device 35 are connected and sealed by a magnetic fluid device.

In an embodiment of the present disclosure, the front feeding port of the tubular reactor 341 is connected with the front gas intake unit 321 via a flange.

In some embodiments of the present disclosure, the tubular reactor 341 has an outlet with a tapered diameter structure. That is to say, the outlet of the tubular reactor 341 is connected with the collection device 35 by a tapered diameter flange.

In some embodiments of the present disclosure, in order to separate and collect most of the product from the gas-solid mixture, the collection device 35 may include, but not limited to an electrostatic collector and a cyclone separator.

In some embodiments of the present disclosure, in order to further block the powder in the exhaust gas, a microporous ceramic filter may be installed in the exhaust unit 36.

In an embodiment of the present disclosure, the apparatus 1 may be used to prepare a silicon-carbon composite. For preparing the silicon-carbon composite, the temperature in the main reaction zone is in the range of 300-1300° C.

In some embodiments of the present disclosure, for preparing the silicon-carbon composite, the solid material may be a carbon-based material, including but not limited to graphite, mesocarbon microbeads, and amorphous carbon. The feeding rate of the solid feeding device 311 is in the range of 10-30 g·min$^{-1}$.

In some embodiments of the present disclosure, for preparing the silicon-carbon composite, the silicon source is chlorosilane, including but not limited to trichlorosilane, dichlorodisilane, and silicon tetrachloride, and the flow rate is in the range of 300-1200 mL·min$^{-1}$.

In some embodiments of the present disclosure, for preparing the silicon-carbon composite, the carbon source is hydrocarbons, including but not limited to acetylene, methane, toluene, and ethanol, and the flow rate is in the range of 200-700 mL·min$^{-1}$.

In some embodiments of the present disclosure, for preparing the silicon-carbon composite, the carrier gas is a reducing gas or an inert gas, including but not limited to hydrogen, nitrogen, and argon, and the flow rate is in the range of 500-2000 mL·min$^{-1}$.

In some embodiments of the present disclosure, for preparing the silicon-carbon composite, the auxiliary gas may be, but not limited to, phosphine, arsine or borane, and a volume ratio of the auxiliary gas to the main reaction gas is in the range of 1:10 to 1:30.

In some embodiments of the present disclosure, for preparing the silicon-carbon composite, the auxiliary gas may be replaced by, but not limited to, solid red phosphorus or arsenic.

The apparatus 1 according to embodiments of the present disclosure has various advantages. For example, for preparing the silicon-carbon composite, the apparatus 1 according to embodiments of the present disclosure has a large available reaction volume, a high degree of continuity and automatic control, a large single-batch processing capacity, and a high continuous production efficiency. For example, for a laboratory pilot device according to an embodiment which has a reactor 34 with a diameter of 100 mm and an effective length of 900 mm, its single throughput in the batch reaction mode may reach 10 kg, and the fastest continuous treatment capacity is 1.8 kg·h$^{-1}$.

In addition, the apparatus 1 according to embodiments of the present disclosure has a wider range of applications (taking the preparation of silicon-carbon composites as an example), it is suitable for a variety of gas and solid raw materials, and may be used to prepare qualified silicon-carbon composites through different silicon sources, carbon sources, auxiliary materials, carrier gases, etc.

In addition, the apparatus 1 according to embodiments of the present disclosure has a good compatibility (taking the preparation of silicon-carbon composites as an example), it is very suitable for application scenarios where current products need to be modified, and may be better combined and integrated with current production lines.

In addition, for preparing the silicon-carbon composite as anode materials of lithium-ion batteries by the apparatus 1 according to embodiments of the present disclosure, the silicon active component is uniformly deposited on the surface of the carbon-based material with stable properties by chemical vapor deposition, which may inhibit the volume expansion of the silicon-based material. Moreover, for preparing the silicon-carbon composite as anode materials of lithium-ion batteries by the apparatus 1 according to embodiments of the present disclosure, anode materials recovered from waste batteries may be used as the raw materials to prepare the silicon-carbon anode products, which is conducive to the in-depth development of battery recycling technology and solves the post-processing problem of recycled battery materials. Moreover, for the preparation of the silicon-carbon composite as anode materials of lithium-ion batteries by the apparatus 1 according to embodiments of the present disclosure, the silicon-based and carbon-based raw materials are widely available and belong to bulk industrial products, which makes the production costs low, the corresponding "three-waste" treatment technologies are mature, and the process is safe and environmentally-friendly.

In the apparatus for preparing a composite according to embodiments of the present disclosure, the angle between the apparatus base and the apparatus body is adjusted by the elevator device, the solid raw material is loaded into the reactor by the solid feeding device, the main reaction gas, the auxiliary gas and the carrier gas are introduced from the front gas intake unit into the main reaction zone at a presetted ratio, followed by the active material deposited on solid particles, and the post-processing reaction gas is introduced from the middle gas intake unit to the post-processing reaction zone to form a functional layer on the active material. The composite powder is sent into the collection device through the outlet of the reactor, and the composite powder is separated from the gas-solid mixture in the collection device. The exhaust gas is released from the outlet of the exhaust manifold of the collection device to an exhaust gas treatment system after minority powders captured by the filter. As a result, a safe, efficient, and inexpensive composite preparation apparatus is provided, such that the composite may be prepared by solid and gas raw materials, which is of great significance to the production and application of high-performance silicon-carbon composite anode materials.

In order to realize the above-mentioned embodiments, the present disclosure provides in embodiments a method for preparing a composite.

Figure 3:
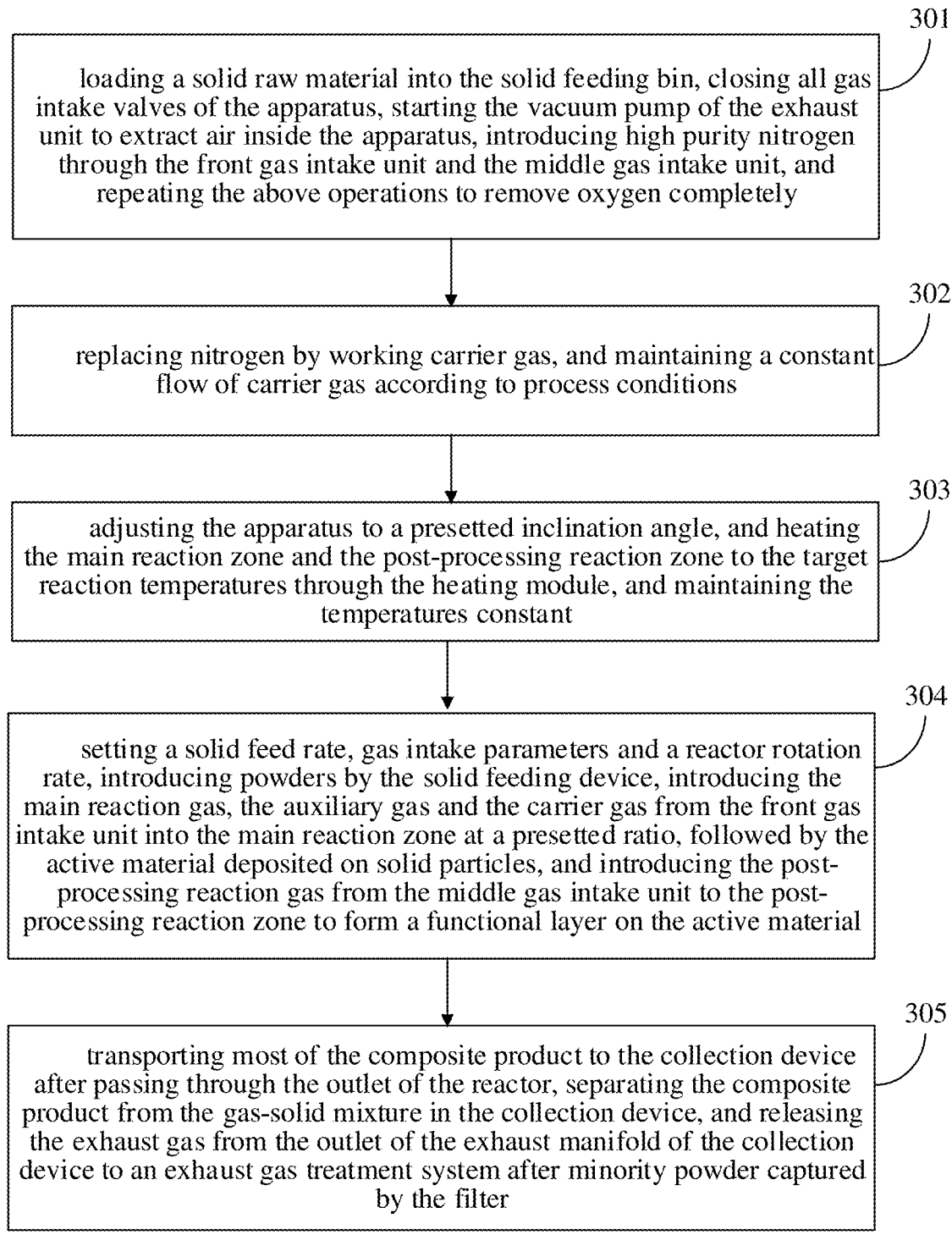
FIG. 3 is a schematic flow chart of a method for preparing a composite according to an embodiment of the present disclosure.

As shown in FIG. 3, the method for preparing the composite according to embodiments of the present disclosure may include the following operations as illustrated in blocks of FIG. 3.

At block 301, a solid raw material is loaded into the solid feeding bin, all gas intake valves of the apparatus are closed, the vacuum pump of the exhaust unit is started to extract air inside the apparatus, high purity nitrogen is introduced through the front gas intake unit and the middle gas intake unit, and the above operations are repeated to remove oxygen completely.

At block 302, nitrogen is replaced by working carrier gas, and a constant flow of carrier gas is maintained according to process conditions.

At block 303, the apparatus is adjusted to a presetted inclination angle, and the main reaction zone and the post-processing reaction zone are heated to target reaction temperatures through the heating module, and the temperatures are maintained constant.

At block 304, the solid feeding rate, gas intake parameters and the reactor rotation rate are set, powders are introduced by the solid feeding device, the main reaction gas, the auxiliary gas and the carrier gas are introduced from the front gas intake unit into the main reaction zone at a presetted ratio, followed by the active material deposited on solid particles, and the post-processing reaction gas is introduced from the middle gas intake unit to the post-processing reaction zone to form a functional layer on the active material.

At block 305, composite powders are sent into the collection device through the outlet of the reactor, the composite powder is separated from the gas-solid mixture in the collection device, the exhaust gas is released from the outlet of the exhaust manifold of the collection device to an exhaust gas treatment system after minority powders captured by the filter.

For example, the process flow for preparing coated composite powder according to embodiments of the present disclosure is as follows:

(1) loading a solid raw material, closing all gas intake valves, starting the vacuum pump of the exhaust unit to extract air inside the apparatus, introducing high purity nitrogen through the front gas intake unit and the middle gas intake unit, and repeating the above operations 3 times to remove oxygen completely;

(2) repeating the operations of step (1), replacing nitrogen by working carrier gas, and maintaining a constant flow of carrier gas according to process conditions;

(3) lifting the apparatus to a presetted inclination angle according to the process need, and setting a heating program to heat the main reaction zone and the post-processing reaction zone to target reaction temperatures, and maintaining the temperatures constant;

(4) setting a solid feeding rate and gas intake parameters, introducing powders by the solid feeding device, introducing the main reaction gas, the auxiliary gas and the carrier gas from the front gas intake unit into the main reaction zone at a presetted ratio, followed by the active material deposited on solid particles, and introducing the post-processing reaction gas from the middle gas intake unit to the post-processing reaction zone to form a functional layer on the surface of the active material; and (5) transporting most of the composite powder into the collection device through the tapered flange at the second end of the reactor, collecting the composite powder into the collection device under the action of electrostatic force or centrifugal force, releasing the exhaust gas from the exhaust manifold to the exhaust gas treatment system after minority powder filtered by a microporous ceramic filter.

In the preparation process, the material ratio is adjusted by the gas feeding rates and the solid feeding rates, and the material residence time, gas-solid contact are adjusted by the inclination angle and the rotation rate of the apparatus, and the chemical reaction is adjusted by temperatures, thereby controlling key indicators such as active material deposition, active material doping modification, surface functional layer deposition and production efficiency.

In an embodiment, graphite (with an average particle size of 16.396 μm), chlorosilane, phosphine, red phosphorus, hydrogen, acetylene may be used as the raw materials to prepare silicon-carbon composites.

In the first example of the present disclosure, graphite powders were loaded into the solid feeding bin, and hydrogen was used as the carrier gas to replace the atmosphere inside the apparatus. The inclination angle of the apparatus was adjusted to 5°, and the reaction rotation rate was adjusted to 3 rpm. The main reaction zone and the post-processing reaction zone were heated by the heating module to 300° C. and 900° C., respectively. The graphite powder was transported into the reactor at a rate of 15 g·min$^{-1}$. Dichlorosilane and hydrogen were pumped into the reactor with flow rates of 500 mL·min$^{-1}$ and 1000 mL·min$^{-1}$, respectively, by the front gas intake unit. Acetylene was introduced into the reactor with a flow rate of 500 mL·min$^{-1}$ by the middle gas intake unit. After running for 1 h, the powder product was gathered and analyzed, with an average particle size of 16.613 μm.

In the second example of the present disclosure, graphite powders were loaded into the solid feeding bin, and hydrogen was used as the carrier gas to replace the air inside the apparatus. The inclination angle of the apparatus was adjusted to 10°, and the reaction rotation rate was adjusted to 7 rpm. Both the main reaction zone and the post-processing reaction zone were heated to 900° C. by the heating module. The graphite powder was transported into the reactor at a rate of 25 g·min$^{-1}$. Trichlorosilane and hydrogen were pumped into the reactor with flow rates of 500 mL·min$^{-1}$ and 1000 mL·min$^{-1}$, respectively, by the front gas intake unit. Acetylene was introduced into the reactor with a flow rate of 500 mL·min$^{-1}$ by the middle gas intake unit. After running for 1 h, the powder product was gathered and analyzed, with an average particle size of 16.487 μm.

In the third example of the present disclosure, graphite powders were loaded into the solid feeding bin, and hydrogen was used as the carrier gas to replace the atmosphere inside the apparatus. The inclination angle of the apparatus was adjusted to 10°, and the reaction rotation rate was adjusted to 10 rpm. The main reaction zone and the post-processing reaction zone were heated by the heating module to 1050° C. and 900° C., respectively. The graphite powder was transported into the reactor at a rate of 25 g·min$^{-1}$. Trichlorosilane, phosphine and hydrogen were pumped into the reactor with flow rates of 800 mL·min$^{-1}$, 25 mL·min$^{-1}$ and 1500 mL·min$^{-1}$, respectively, by the front gas intake unit. Acetylene was introduced into the reactor with a flow rate of 800 mL·min$^{-1}$ by the middle gas intake unit. After running for 1 h, the powder product was gathered and analyzed, with an average particle size of 16.734 μm.

In the fourth example of the present disclosure, mixed powders of graphite and red phosphorus (red phosphorus accounts for 5 wt %) were loaded into the solid feeding bin, and hydrogen was used as the carrier gas to replace the atmosphere inside the apparatus. The inclination angle of the apparatus was adjusted to 10°, and the reaction rotation rate was adjusted to 10 rpm. The main reaction zone and the post-processing reaction zone were heated by the heating module to 1050° C. and 900° C., respectively. The graphite powder was transported into the reactor at a rate of 25 g·min$^{-1}$. Trichlorosilane and hydrogen were pumped into the reactor with flow rates of 500 mL·min$^{-1}$ and 1500 mL·min$^{-1}$, respectively, by the front gas intake unit. Acetylene was introduced into the reactor with a flow rate of 500 mL·min$^{-1}$ by the middle gas intake unit. After running for 1 h, the powder product was gathered and analyzed, with an average particle size of 16.623 μm.

In the fifth example of the present disclosure, graphite powders were loaded into the solid feeding bin, and hydrogen was used as the carrier gas to replace the atmosphere inside the apparatus. The inclination angle of the apparatus was adjusted to 10°, and the reaction rotation rate was adjusted to 10 rpm. The main reaction zone and the post-processing reaction zone were heated by the heating module to 1300° C. and 900° C., respectively. The graphite powder was transported into the reactor at a rate of 15 g·min$^{-1}$. Silicon tetrachloride and hydrogen were pumped into the reactor with flow rates of 500 mL·min$^{-1}$ and 1500 mL·min$^{-1}$, respectively, by the front gas intake unit. Acetylene was introduced into the reactor with a flow rate of 500 mL·min$^{-1}$ by the middle gas intake unit. After running for 1 h, the powder product was gathered and analyzed, with an average particle size of 16.574 μm.

It should be noted that the foregoing explanations related to the apparatus for preparing a composite are also applicable to the method for preparing a composite according to embodiments of the present disclosure, which will not be elaborated herein.

In the method for preparing a composite according to embodiments of the present disclosure, the angle between the apparatus base and the apparatus body is adjusted by the elevator device, the solid raw material is loaded into the reactor by the solid feeding device, the main reaction gas, the auxiliary gas and the carrier gas are introduced from the front gas intake unit into the main reaction zone at a presetted ratio, followed by the active material deposited on solid particles, and the post-processing reaction gas is introduced from the middle gas intake unit to the post-processing reaction zone to form a functional layer on the active material. The prepared composite powder is sent into the collection device through the outlet of the reactor, and the composite powder is separated from the gas-solid mixture in the collection device. The exhaust gas is released from the outlet of the exhaust manifold of the collection device into an exhaust gas treatment system after minority powder captured by the filter. As a result, a safer, efficient, and inexpensive composite preparation method is provided, such that the composite may be prepared by solid and gas raw materials, which is of great significance to the production and application of high-performance silicon-carbon composite anode materials for lithium-ion batteries.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial," and "circumferential" should be construed to refer to the orientation as then described or as shown in the drawings under discussion. These relative terms are only for convenience of description, but do not indicate or imply that the apparatus, device or element referred to must have a particular orientation, or be constructed or operated in a particular orientation, and thus shall not be construed to limit the present disclosure.

In addition, terms such as "first" and "second" are used herein only for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, such as two, three, etc., unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications or interaction of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in embodiments," "in one embodiment", "in an embodiment", "in another example," "in an example," "in a specific example," or "in some examples,"

in various places throughout this specification are not necessarily referring to the same embodiment or example of the present disclosure. Furthermore, the particular features, structures, materials, or characteristics may be combined in any suitable manner in one or more embodiments or examples. In addition, in the absence of contradiction, those skilled in the art can combine the different embodiments or examples described in this specification, or combine the features of different embodiments or examples.

Although explanatory embodiments and examples have been shown and described above, it would be appreciated by those skilled in the art that the above embodiments and examples cannot be construed to limit the present disclosure, and changes, alternatives, variants and modifications can be made in the embodiments without departing from spirit, principles and scope of the present disclosure.

What is claimed is:

1. An apparatus for preparing a composite, comprising:
   an apparatus base;
   an apparatus body; and
   an elevator device disposed on the apparatus base;
   wherein the elevator device is configured to adjust an angle between the apparatus base and the apparatus body;
   wherein the apparatus body comprises a solid feeding bin, gas intake units, a heating module, a reactor, a collection device, an exhaust unit and a control unit, and the control unit is connected and communicated with the solid feeding bin, the gas intake units, the heating module, the reactor, the collection device and the exhaust unit, respectively;
   wherein a solid feeding device is disposed inside the solid feeding bin;
   wherein the gas intake units comprise a front gas intake unit and a middle gas intake unit;
   wherein a front feeding port is disposed at a first end of the reactor, and a middle feeding port is disposed at the middle of the reactor; wherein the front feeding port is connected with the solid feeding device and the front gas intake unit, respectively, and the middle feeding port is connected with the middle gas intake unit; an outlet is disposed at a second end of the reactor, and the outlet is connected with the collection device;
   wherein the reactor is divided into a first region and a second region by the middle feeding port, and the first region and the second region are a main reaction zone and a post-processing reaction zone, respectively;
   wherein the reactor is wrapped inside the heating module, and the heating module is configured to heat the main reaction zone and the post-processing reaction zone to target reaction temperatures, and maintain the temperatures constant;
   wherein the collection device is configured to separate and collect a product from a gas-solid mixture; and
   wherein the exhaust unit is connected with the collection device by an outlet of an exhaust manifold, the exhaust unit comprises a vacuum pump and a filter, the vacuum pump is configured to regulate the internal pressure of the reactor, and the filter is configured to capture powders in the exhaust.

2. The apparatus for preparing a composite of claim 1, wherein the reactor is a tubular reactor, fins are uniformly distributed on the inner wall of the tubular reactor, and the fins are used for stirring the solid powder to make the solid powder and gas reactants fully contact.

3. The apparatus for preparing a composite of claim 2, wherein the tubular reactor is rotatable around a central axis thereof.

4. The apparatus for preparing a composite of claim 2, wherein the tubular reactor is made from quartz or corundum, and the tubular reactor has an outlet with a tapered diameter structure.

5. The apparatus for preparing a composite of claim 1, wherein the heating module comprises a heating element, the heating element is comprised of silicon molybdenum bars, the heating module adopts a configuration of multi-segment temperature zones, which are independently controlled by intelligent programs, and the heating module has an openable steel shell, and the space between the heating module and the reactor is filled with thermal insulation materials made of aluminum oxide fibers.

6. The apparatus for preparing a composite of claim 1, wherein the collection device comprises an electrostatic collector or a cyclone separator.

7. The apparatus for preparing a composite of claim 1, wherein the front gas intake unit comprises a three-way mass flow meter, which controls flow rates of reaction gas, auxiliary gas and carrier gas, respectively, and mixes and feeds the reaction gas, the auxiliary gas and the carrier gas into the reactor, the middle gas intake unit comprises a two-way mass flow meter, which controls flow rates of post-processing reaction gas and carrier gas, respectively, and mixes and feeds the post-processing reaction gas and the carrier gas into the reactor.

8. The apparatus for preparing a composite of claim 1, wherein gas intake nozzles of the front gas intake unit and the middle gas intake unit adopt a coaxial tube type, and inner walls of the front gas intake unit and the middle gas intake unit adopt a spiral fin design.

9. The apparatus for preparing a composite of claim 1, wherein the solid feeding bin is made from stainless steel, has a cuboid cavity, and comprises a top cover and a bin body, and a silicone sealing ring is arranged between the top cover and the bin body.

10. The apparatus for preparing a composite of claim 1, wherein the reactor and the solid feeding device are connected and sealed by a magnetic fluid device, and the reactor and the collection device are connected and sealed by a magnetic fluid device.

11. The apparatus for preparing a composite of claim 1, wherein the angle between the apparatus base and the apparatus body is adjustable by the elevator device in the range of 0-90°.

12. The apparatus for preparing a composite of claim 11, wherein the angle between the apparatus base and the apparatus body is 0°.

13. The apparatus for preparing a composite of claim 11, wherein the angle between the apparatus base and the apparatus body is 90°.

14. The apparatus for preparing a composite of claim 11, wherein the angle between the apparatus base and the apparatus body is in the range of 0-40°.

15. The apparatus for preparing a composite of claim 11, wherein a microporous ceramic filter is installed in the exhaust unit.

16. The apparatus for preparing a composite of claim 11, wherein the composite is a silicon-carbon composite.

17. A method for preparing a composite using the apparatus according to claim 1, comprising:
   loading a solid raw material into the solid feeding bin, closing all gas intake valves of the apparatus, starting the vacuum pump of the exhaust unit to extract air inside the apparatus, introducing high purity nitrogen through the front gas intake unit and the middle gas intake unit, and repeating the above operations to remove oxygen completely;

replacing nitrogen by working carrier gas, and maintaining a constant flow of carrier gas according to process conditions;

adjusting the apparatus to a preset inclination angle, and heating the main reaction zone and the post-processing reaction zone to the target reaction temperatures through the heating module, and maintaining the temperatures constant;

setting a solid feed rate, gas intake parameters and a reactor rotation rate, introducing powders by the solid feeding device, introducing the main reaction gas, the auxiliary gas and the carrier gas from the front gas intake unit into the main reaction zone at a preset ratio, followed by the active material deposited on solid particles, and introducing the post-processing reaction gas from the middle gas intake unit to the post-processing reaction zone to form a functional layer on the active material;

transporting most of the composite product to the collection device after passing through the outlet of the reactor, separating the composite product from the gas-solid mixture in the collection device, and releasing the exhaust gas from the outlet of the exhaust manifold of the collection device to an exhaust gas treatment system after minority powder captured by the filter.

18. The method of claim 17, wherein the solid raw material is a carbon-based material selected from a group consisting of: graphite, mesocarbon microbeads, and amorphous carbon powders.

19. The method of claim 17, wherein the main reaction gas is a silicon source selected from a group consisting of: trichlorosilane, dichlorodisilane, and silicon tetrachloride;

the auxiliary gas is selected from a group consisting of: phosphine, arsine, borane, solid red phosphorus and arsenic; and carrier gas is a reducing gas or an inert gas.

20. The method of claim 17, wherein the post-processing reaction gas is a carbon source selected from a group consisting of: acetylene, methane, toluene, and ethanol.

* * * * *